(12) United States Patent
Saito et al.

(10) Patent No.: US 7,340,827 B2
(45) Date of Patent: Mar. 11, 2008

(54) COMPONENT MOUNTING APPARATUS

(75) Inventors: Atsushi Saito, Saitama (JP); Akira Kimura, Tokyo (JP)

(73) Assignee: Sony Corporation (JP)

( * ) Notice: Subject to any disclaimer, the term of this patent is extended or adjusted under 35 U.S.C. 154(b) by 244 days.

(21) Appl. No.: 10/981,790

(22) Filed: Nov. 5, 2004

(65) Prior Publication Data

US 2005/0115063 A1    Jun. 2, 2005

(30) Foreign Application Priority Data

Nov. 19, 2003  (JP)  ............................ P2003-389897

(51) Int. Cl.
*H05K 13/00* (2006.01)
*H05K 13/04* (2006.01)
(52) U.S. Cl. .............................. 29/743; 29/739; 29/740
(58) Field of Classification Search .................. 29/709, 29/739, 740, 741, 743; 294/64.1
See application file for complete search history.

(56) References Cited

U.S. PATENT DOCUMENTS

| 4,461,610 A | * | 7/1984 | Harigane et al. ........... 198/431 |
| 6,260,898 B1 | * | 7/2001 | Kano et al. ................ 294/64.1 |

FOREIGN PATENT DOCUMENTS

| JP | HEI-2-99000 | 4/1990 |
| JP | HEI-2-194700 | 8/1990 |
| JP | HEI-4-065197 | 3/1992 |
| JP | HEI-9-181488 | 7/1997 |
| JP | HEI-9-191488 | 7/1997 |
| JP | 10-163677 | 6/1998 |
| JP | 2000-114788 | 4/2000 |
| JP | 2001-223498 | 8/2001 |

OTHER PUBLICATIONS

Japanese Office Action; Application No. 2003-389897; Dated: Nov. 8, 2006.
Japanese Office Action; Application No. 2003-389897; Dated: Jan. 31, 2007.

* cited by examiner

*Primary Examiner*—A. Dexter Tugbang
*Assistant Examiner*—Livius R. Cazan
(74) *Attorney, Agent, or Firm*—Rader Fishman & Grauer PLLC; Ronald P. Kananen

(57) ABSTRACT

A component mounting apparatus is proposed, which has a plurality of vacuum pick-up nozzles attached to a mount head so as to revolve about a main shaft, causing one of the vacuum pick-up nozzles to move to a location to be driven by an actuator that is provided at a designated location in the direction of revolution, and causing the vacuum pick-up nozzle to make a forward movement by the actuator for vacuum pick-up and/or mounting of a component, wherein each of the vacuum pick-up nozzles is provided with a pushed plate of a designated size in the moving direction of the vacuum pick-up nozzle at a driven portion thereof.

15 Claims, 11 Drawing Sheets

FIG. 11
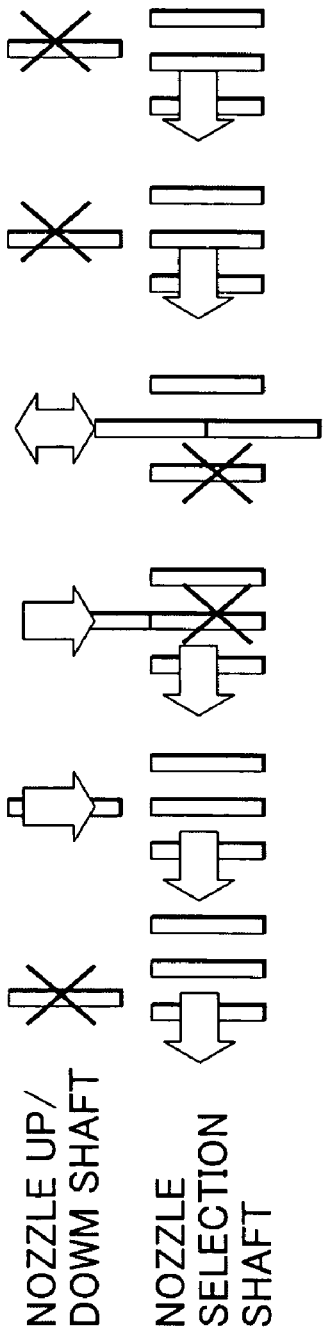
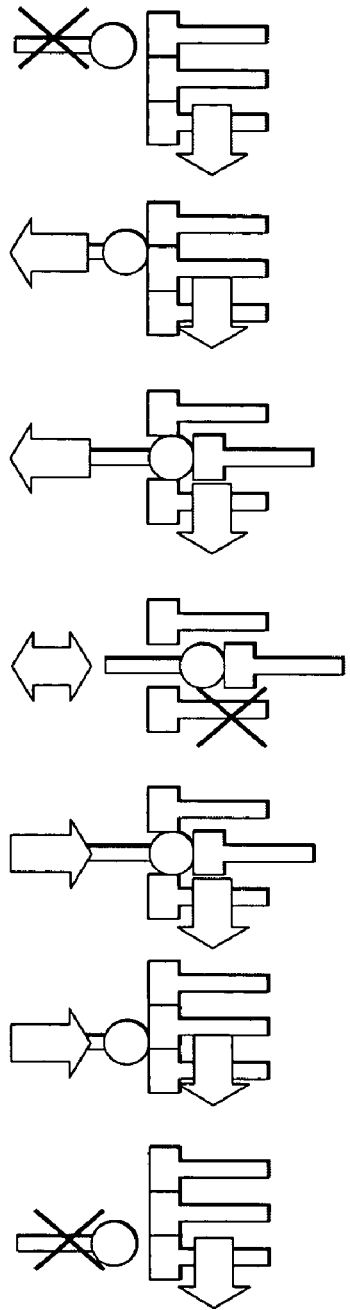

COMPONENT MOUNTING APPARATUS

CROSS REFERENCE TO RELATED APPLICATION

This application claims priority from Japanese Priority Application No. 2003-389897, filed on Nov. 19, 2003 with the Japanese Patent Office, the entire content of which is hereby incorporated by reference.

BACKGROUND OF THE INVENTION

1. Field of the Invention

The present invention relates to a component mounting apparatus, more specifically to one having a plurality of vacuum pick-up nozzles which are mounted on a mounting head to revolve about a supporting shaft, wherein the vacuum pick-up nozzles are moved to a location as operated by an actuator mounted on a designated location in the direction of revolution, thereby making a forward movement of the vacuum pick-up nozzles by the actuator in order to perform pick-up and/or mounting a component.

2. Description of Related Art

For making electronic circuits by mounting components on a circuit board, a mounting machine is widely used. The mounting machine is provided with a vacuum pick-up nozzle that picks up a component and is moved in the directions of the X axis and Y axis relative to the circuit board to the designated location above the mounting position on the circuit board. Subsequently, the vacuum pick-up nozzle is made to descend toward the circuit board for mounting the component on the designated position on the circuit board.

Conventionally, large and high speed machines so-called rotary machines were the mainstream. However, in recent years, such rotary machines are losing popularity because they are large and expensive and thus compact machines having movable mounting heads are the mainstream now. In compact mounting machines of a type having a movable head for mounting small components such as chip or the like, it is typical that a single tool head has a plurality of nozzles in the order of, for example 4 to 12 in order to improve productivity by shortening the tact time. Such mounting machines are known as cell type mounting machines.

The mounting machines having a plurality of nozzles on the tool head are further classified into two kinds. One is a type having only a single actuator at one point in the direction of revolution for moving the vacuum pick-up nozzles up and down, thereby performing a vacuum pick-up and mounting operation by revolving the nozzles below the actuator. The other is a type having the nozzles fixed to the tool head rather than revolving in the direction of circumference and an actuator is provided for each nozzle for moving up and down.

The first type as mentioned hereinabove is advantageous in that the amount of movement of the head is small and a sufficiently powerful actuator can be used because only one actuator is used for moving the nozzles up and down in the case of continuous pick-up from a single cassette or mounting chips adjacent to one another with a small pitch. Accordingly, since the up and down stroke time of the nozzles can be reduced, capacity per tool head can be enhanced. Such type of mounting machines is known as a cell type middle speed machine. Such mounting machines are disclosed, for example in Japanese Patent Application Publication No. HEI 9-191488 and Japanese Patent Application Publication No. 2001-223498.

In the case of a revolving tool head having a plurality of vacuum pick-up nozzles along the circumference, a large number of nozzles move at a high speed in the circumferential direction about the axis of revolution and make the down-stroke by the push-down of a lever of the abovementioned actuator at the time when they come below the actuator. It is to be noted that the lever can simply push down, and the up-stroke of the nozzles depends on a restoration force of a spring as the lever moves up. Let the revolving moving time of the nozzle in the circumferential direction within the tool head and the moving time of the nozzles in the up and down direction be T1 and T2, respectively, and the numerical value to be the basis of the tact time of the mounting machine is T1+T2. Since T1 and T2 are the numerical numbers that are to be minimized as much as possible under various restricted conditions, each value may have a certain room to be reduced but T1+T2 is the basis of the tact time, which is the limitation of the conventional mounting machines.

However, in the case of a revolving tool head, there is, for example a 14 mm stroke for up and down movement of the nozzles. In the case of picking up and mounting a small chip of about 2 mm in component height, the nozzles are mostly required to be moved with proper alignment only about 3 mm near the bottom end of the up and down stroke. In other words, there is no problem in principle if the nozzles may simultaneously move and go up and down during a 14−3=11 mm stroke. This means that the T1+T2−(the time of the simultaneous movement) can be the basis of the tact time. Unfortunately, however, the reality is to set the time of the simultaneous movement to essentially zero due to friction and mechanical interference, thereby restricting the reduction of the tact time in conventional mounting machines.

(Reference patent document 1) Japanese Patent Application Publication No. HEI 9-181488

(Reference patent document 2) Japanese Patent-Application Publication No. 2001-223498

(Reference patent document 3) Japanese Patent-Application Publication No. 2000-114788

(Reference patent document 4) Japanese Patent-Application Publication No. HEI 2-99000

(Reference patent document 5) Japanese Patent-Application Publication No. HEI-2-194700

SUMMARY OF THE INVENTION

There is a need for providing a component mounting apparatus capable of reducing the tact time.

There is another need for providing a component mounting apparatus in which the tact time is not restricted by the sum of the time of the vacuum pick-up nozzles to move to the location driven by the actuator and the stroke time for pick-up and mounting.

There is still another need for providing a component mounting apparatus provided with a mechanism for enabling the operation times of the nozzle moving shaft and the nozzle up/down shaft to largely overlap.

There is yet another need for providing a component mounting apparatus provided with an avoiding mechanism for avoiding mechanical interference at the time of emergency stop or the like, thereby preventing damage to the nozzles at the time of emergency stop.

The aforementioned and other aims of the present invention will become apparent from the subject matter and the embodiments of the present invention that will be described hereunder.

A primary aspect of the present invention is to provide a component mounting apparatus having a plurality of vacuum pick-up nozzles attached to a mount head so as to revolve about a main shaft, causing one of the vacuum pick-up nozzles to move to a location to be driven by an actuator that is provided at a designated location in the direction of revolution, and causing the vacuum pick-up nozzle to make a forward movement by the actuator for vacuum pick-up and/or mounting of a component, wherein each of the vacuum pick-up nozzles is provided with a pushed plate of a designated size in the moving direction of the vacuum pick-up nozzle at a driven portion thereof.

Preferably, the pushed plate is a circular disk. It is also preferable that the circular disk is rotatably attached to each vacuum pick-up nozzle. Also, a driving portion of the actuator is preferably a rotary member. It is also preferable that the driving portion of the actuator is a roller that can rotate in the direction of revolution. Preferably, the driving portion of the actuator can be swingable. It is also preferable that the driving portion of the actuator is a roller rotatably supported by a support that can be swingably pivoted about a supporting shaft.

Another major aspect of the present invention is to provide a component mounting apparatus having a plurality of vacuum pick-up nozzles attached to a mount head so as to revolve about a main shaft, causing one of the vacuum pick-up nozzles to move to a location to be driven by an actuator that is provided at a designated location in the direction of revolution, and causing the vacuum pick-up nozzles to make a forward movement by the actuator for vacuum pick-up and/or mounting of a component, wherein a control means is provided for controlling the vacuum pick-up nozzle to make a forward movement by the actuator at the time when the actuator is moved to a location not to interfere with an adjacent vacuum pick-up nozzle in the process of moving the vacuum pick-up nozzles in the direction of revolution by the actuator to a location to be operated by the actuator. Also, the vacuum pick-up nozzles can move forward to pick-up or mount the components.

Still another major aspect of the present invention is to provide a component mounting apparatus having a plurality of vacuum pick-up nozzles attached to a mount head so as to revolve about a main shaft, causing one of the vacuum pick-up nozzles to move to a location to be driven by an actuator that is provided at a designated location in the direction of revolution for vacuum pick-up and/or mounting of a component, wherein a control means is provided for controlling the mounting head to revolve about the main shaft at the time when the actuator makes a backward movement to a position not to interfere with adjacent vacuum pick-up nozzles in the process of backward movement of the vacuum pick-up nozzle.

It is preferable that the backward movement of the vacuum pick-up nozzle is made subsequent to vacuum pick-up or mounting of the component by the vacuum pick-up nozzle.

Yet another aspect of the present invention is that the vacuum pick-up nozzle picks up the component and also mounts the picked component on a designated location on a circuit board.

A preferred embodiment of the present invention is a nozzle having a disk shaped receiving face at the upper end, wherein overlapping of the moving time and the up/down time of the vacuum pick-up nozzle is realized and the lever of the actuator is prevented from falling between vacuum pick-up nozzles by providing a disk having a sufficient radius for the aforementioned overlapping in time at the top end of each nozzle.

Still another preferred embodiment of the present invention is a lever for the actuator for up/down operation provided with a nozzle contact portion in the form of a roller. In order to realize the overlapping of the moving time and the stroke time of each vacuum pick-up nozzle, it is required that the nozzles can move while being pushed by the lever. For this end, the nozzle contact portion of the lever is made as a roller that can rotate in the direction of movement of the nozzles, thereby eliminating friction and any other obstacle to prevent movement of the nozzles and achieving a smooth overlap.

Yet another embodiment of the present invention is suppressing disturbance of the nozzle spinning shaft and slip between the disk and the roller.

The above embodiments realize the overlapping of the operation times. However, the vacuum pick-up nozzles not only move but also spin for mailing an adjustment of the orientation of the component to be mounted. The nozzle must revolve while being pushed by the roller of the lever. Similarly, since revolving of the tool head and the spinning of the vacuum pick-up nozzle are overlapped in time with the operation of the stroke shaft, contact of the disk and the roller may prevent spinning of the nozzle. Accordingly, the top end of the nozzle, e.g., the disk is made to rotate freely with respect to the roller, thereby eliminating the obstacle to spinning of the nozzle.

If the radius of revolution at the top end of the vacuum pick-up nozzle is small, the disk may result in a phenomenon that causes friction due to a difference in the direction of rotation of the roller to avoid friction and the actual direction of movement of the nozzle at the time when the disk and the roller contact each other by the overlapping of the moving time and the stroke time of the vacuum pick-up nozzle. However, such friction can be significantly reduced by the free rotation of the disk as described hereinabove.

Another embodiment of the present invention is countermeasures to avoid damages. Although overlapping of the moving time and the stroke time of the vacuum pick-up nozzles is fairly realistic by the above construction, it is only in the case of normal operation. In the case of driving each shaft by a servo motor and achieving the overlapping by means of software, there may be encountered an emergency stop or a lag in the operation of the motor for some causes. That is, in the case of a high possibility that the motor encounters an emergency stop, there is the possibility of causing mechanical interference. Concrete interference patterns may include the lever for the stroke shaft stopping before it completes the upward stroke and the revolving shaft of the nozzle does not completely stop, thereby damaging the nozzle. In order to prevent such troubles from occurring, the lever is designed to swing in the direction of interference, thereby avoiding interference.

A major invention of this application is a component mounting apparatus having a plurality of vacuum pick-up nozzles attached to a mount head so as to revolve about a main shaft, causing one of the vacuum pick-up nozzles to move to a location to be driven by an actuator that is provided at a designated location, and causing the vacuum pick-up nozzle to make a forward movement by the actuator for vacuum pick-up and/or mounting of a component, wherein each of the vacuum pick-up nozzles has a driven portion provided with a pushed plate of a designated size in the moving direction of the vacuum pick-up nozzle.

According to the component mounting apparatus as described hereinabove, the movement of the vacuum pick-up nozzle associated with the revolving operation of the mounting head and the stroke operation of the vacuum pick-up nozzle by the actuator are made to overlap in time, thereby enabling a reduction in the tact time.

Another major invention of this application is the provision of the control means for controlling the vacuum nozzles to make the forward movement of the vacuum pick-up nozzle by the actuator whenever the actuator moves to the location not to interfere with the adjacent nozzles in the process of moving the vacuum pick-up nozzle in the revolving direction to the position driven by the actuator.

According to the component mounting apparatus, it is possible to achieve overlapping of the movement of the vacuum pick-up nozzle and the forward movement of the vacuum pick-up nozzle while avoiding interference between the actuator and the vacuum pick-up nozzles.

Still another aspect of the present invention is the provision of the control means for controlling the mounting head to revolve about the supporting shaft whenever the actuator makes the backward movement to the position not to interfere with adjacent vacuum pick-up nozzles.

According to such component mounting apparatus, it is possible to overlap the backward operation of the stroke of the actuator and the revolving operation of the mounting head while avoiding interference between the vacuum pick-up nozzles and the actuator.

Further features of the invention, and the advantages offered thereby, are explained in detail hereinafter, with reference to specific embodiments of the invention illustrated in the accompanying drawings.

BRIEF DESCRIPTION OF THE DRAWINGS

FIG. 11 is a schematic front view illustrating the overlapping operation of the vacuum pick-up nozzles in revolving and up/down movement.

DESCRIPTION OF THE PREFERRED EMBODIMENT

Figure 1:
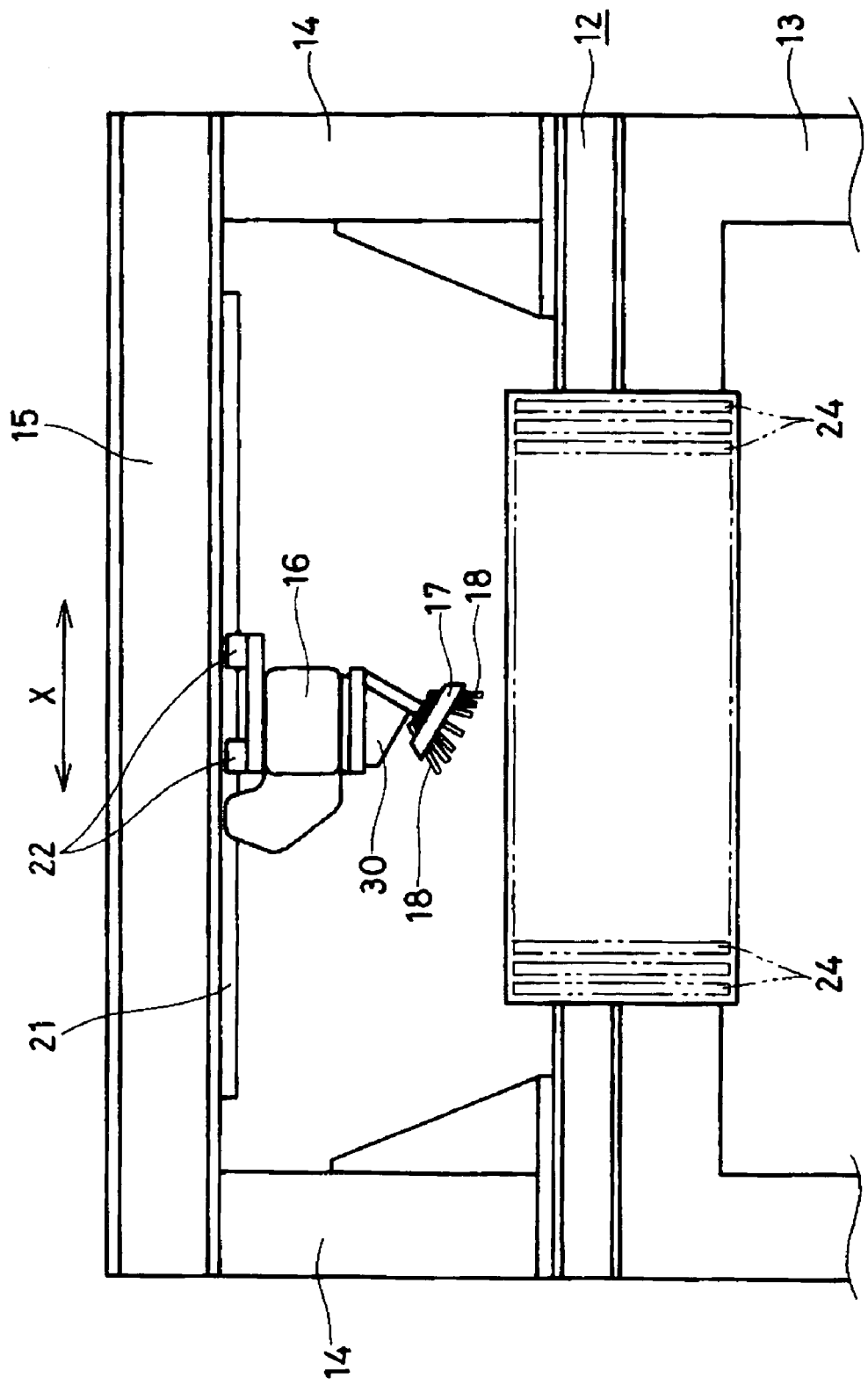
FIG. 1 is a front view illustrating the whole construction of a component mounting apparatus according to the present invention.
Figure 2:
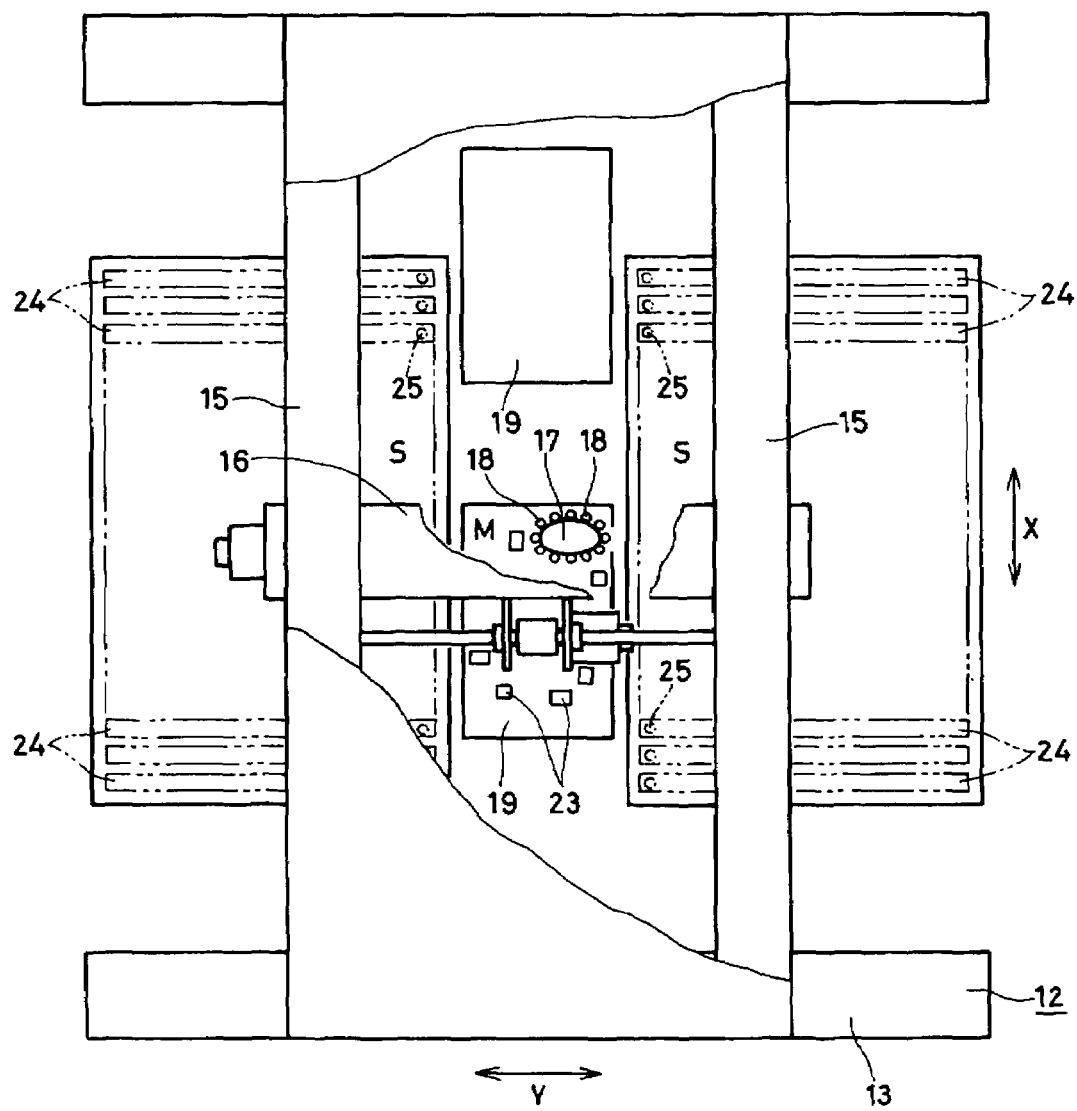
FIG. 2 is a plan view illustrating the partial cross-section of the component mounting apparatus.
Figure 3:
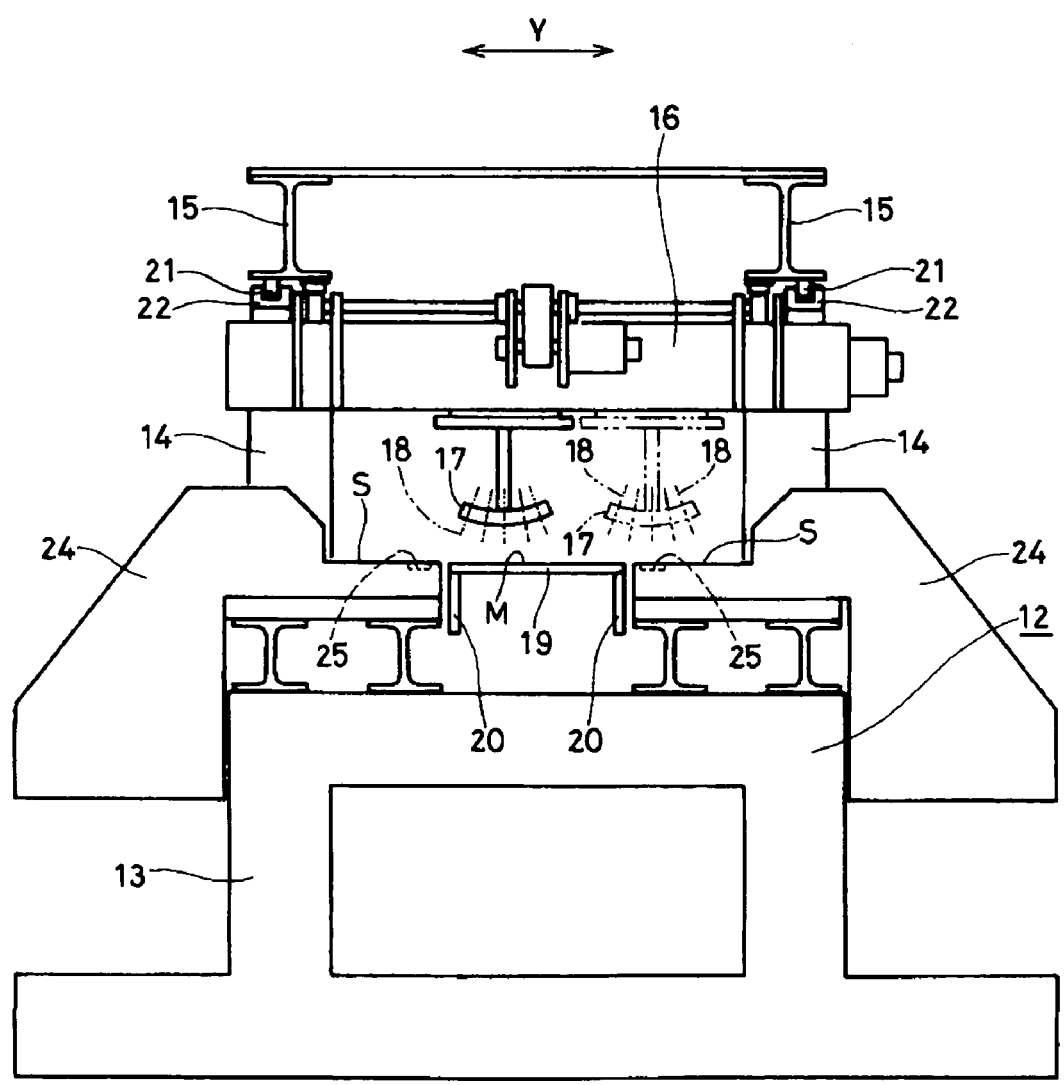
FIG. 3 is an elevational view illustrating the main portion of the component mounting apparatus.

FIG. 1-FIG. 3 show the whole component mounting apparatus according to a preferred embodiment of the present invention. The component mounting apparatus comprises a base 12, a table 13 for supporting the base 12, four support legs 14 provided at both left and right end portions for supporting both end portions in the forward/backward direction of the table 13, crossbars 15 bridging over the longitudinal direction of the table 13 at the top ends of the pair of support legs 14 separated in the forward/backward direction, a head loading beam 16 bridging between the crossbars 15 in such a manner to depend therefrom, a tool head 17 depending from the head loading beam 16 and a plurality of vacuum pick-up nozzles 18 attached to the tool head 17. It is to be noted herein that the direction as indicated by an arrow X in FIG. 1 and FIG. 2 is referred to as the forward/backward direction or the X-axis direction and the direction as indicated by an arrow Y in FIG. 2 and FIG. 3 is referred to as the left/right direction or the Y-axis direction.

In the upper surface of the base portion 12, the center portion in the left/right direction is referred to as a work positioning area on which holding means 20 for holding a work such as a circuit board 19 is placed. The circuit board 19 is aligned and held in position by the holding means 20. A pair of circuit boards 19 may be disposed on the work positioning area in the forward/backward direction with a designated space.

Clamped on the bottom surfaces of the crossbars 15 is a guide rail 21 in a manner to extend in the X-axis direction. Guide members 22 fixed onto the upper surfaces and at both ends of the head loading beam 16 are slidably engaged with the guide rail 21, thereby movably supporting the head loading beam 16 by the crossbars 15 in the X-axis direction. It is to be noted herein that the head loading beam 16 is provided with driving means (not shown) between itself and the crossbars 15, thereby enabling the head loading beam 16 to run with respect to the crossbars 15.

The tool head 17 is provided to depend from the head loading beam 16 and is supported to move in the Y-axis direction with respect to the head loading beam 16. It is to be noted that the tool head 17 is designed to move in the Y-axis direction by rotation of a ball screw that is provided inside the head loading beam 16.

By the movement in the X-axis direction with respect to the head loading beam 16 and also the movement in the Y-axis direction with respect to the head loading beam 16, the tool head 17 is free to move in both X-axis and Y-axis direction.

The main rotary shaft of the tool head 17 is provided in a slanted condition with respect to the vertical direction and with the bottom end thereof biased toward the front. Also, the tool head 17 is designed to rotate in both normal and reverse directions.

Twelve vacuum pick-up nozzles 18 are disposed at the outer circumference of the tool head with an equal distance in the circumferential direction. Axes of these vacuum pick-up nozzles 18 are slanted with respect to the rotary shaft of the tool head 17 in such a manner that the upper ends approach the rotary shaft of the tool head 17, thereby disposing the twelve vacuum pick-up nozzles 18 like a skirt as a whole with respect to the tool head 17.

Each vacuum pick-up nozzle 18 is supported to move in the respective axial direction and goes down by being pushed by the pushing means to be described hereinafter when it comes to an operation position.

Among these vacuum pick-up nozzles 18, the shaft of the particular vacuum pick-up nozzle 18 at the back end of the tool head 17 or the right most position in FIG. 1 is designed to be vertical and the back end position corresponds to the above mentioned operation position. And the vacuum pick up or release of a chip component 23 is carried out by the vacuum pick-up nozzle 18 in the operation position and also in the vertical position.

There are plural kinds of chip components 23 to be mounted on a single circuit board 19. It is impossible to vacuum pick-up and mount such different chip components 23 using a single kind of vacuum pick-up nozzle 18. Accordingly, plural kinds of vacuum pick-up nozzles 18 are provided, and optimum nozzles are used for picking up and mounting respective components.

The vacuum pick-up nozzles 18 are connected to an air compressor (not shown) for switching tips of the nozzles 18 to positive pressure or negative pressure at a designated timing, thereby vacuum picking up or releasing the chip components 23 to or from the tips of the respective nozzles.

The circuit board 19 that is aligned and held in position by the holding means 20 defines a component mounting area M where chip components 23 are mounted.

Also disposed at both left and right sides of the component mounting area M are forty component feeders 24 each accommodating a large number of the same kind of chip components 23 for feeding such chip components 23 to the respective vacuum pick-up nozzle 18 as the need arises. It is to be noted that the component feeders 24 are described as disposed at both left and right sides of the component mounting area M but the present invention can be applied to a case where such component feeders 24 are disposed at one side of the component mounting area M.

Different kinds of chip components 23 are accommodated in respective component feeders 24 so that the vacuum pick-up nozzles 18 and the component suppliers 24 are chosen for picking up proper chip components 23 depending on the mounting locations on the circuit board 19.

By disposing in parallel at component feeding ends 25 of the component feeders 24 at both left and right sides of the holding means 20, the chip components 23 as disposed at the component feeding ends 25 are picked up by the respective vacuum pick-up nozzles 18. Accordingly, the areas where the component feeding ends 25 are disposed are pick-up areas for picking up the chip components 23.

The tool head 17 is designed so that the vacuum pick-up nozzle 18 in the operation position of the tool head 17 moves within the range connecting the component feeding area S and the component mounting area M.

Firstly, the tool head 17 moves above the component feeding area S and the chip components 23 are then picked up by the twelve vacuum pick-up nozzles 18 in a designated sequence. Subsequently, the tool head 17 moves to the component mounting area M and sequentially mount the components picked by the vacuum pick-up nozzles 18 at designated positions while making adjustment in the X-axis direction and the Y-axis direction. By repeating the above operations, the chip components 23 are mounted on the circuit board 19.

Figure 4:
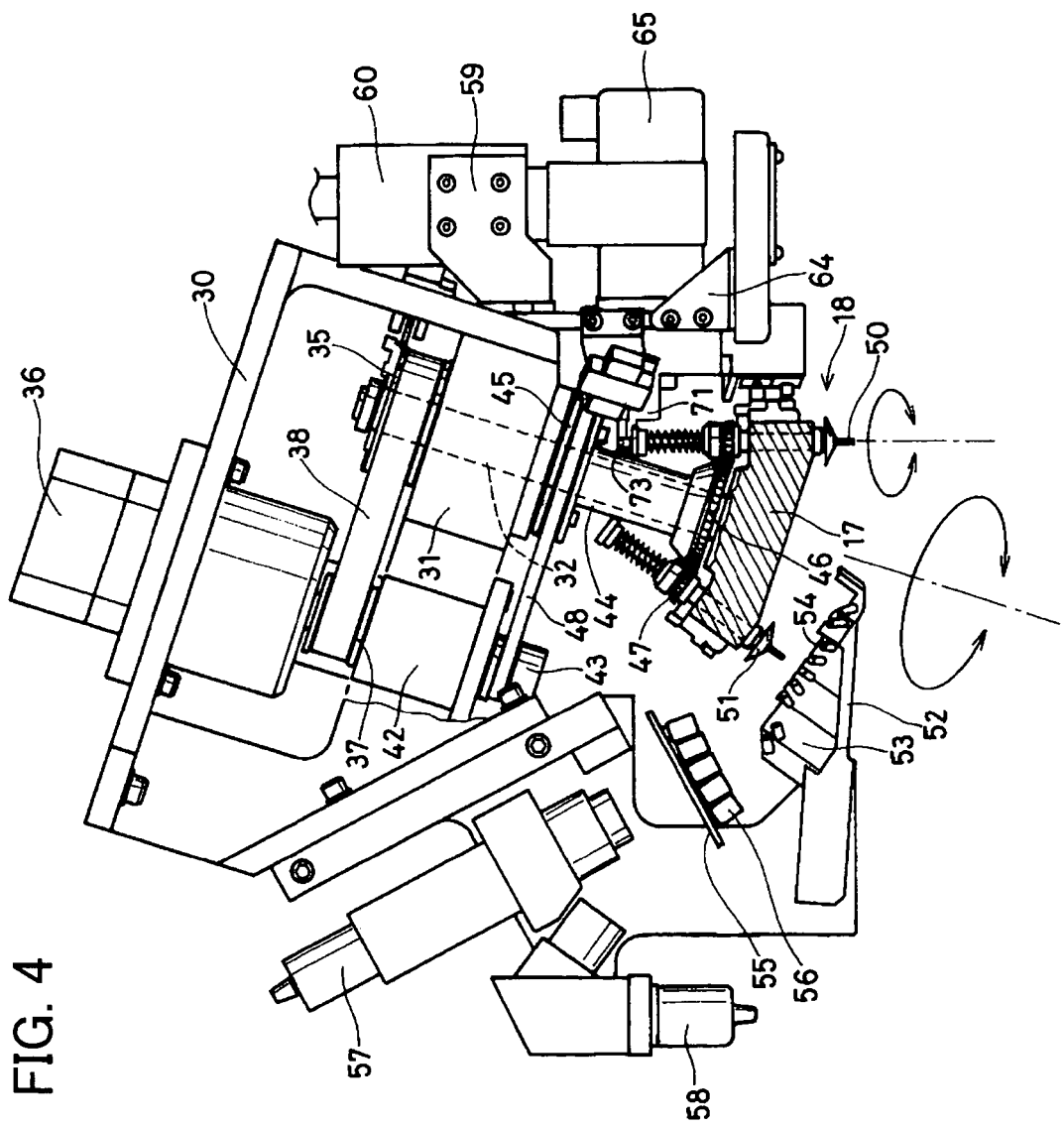
FIG. 4 is a front view illustrating the main portion of a tool head and a driving mechanism thereof.

Now, a description will be given of the tool head 17 that is attached to the bottom end of the head loading beam 16. As shown in FIG. 4, the tool head 17 is attached to a carriage frame 30. The carriage frame 30 is provided with a bearing 31 for rotatably supporting a main shaft 32. It is to be noted that the main shaft 32 is supported at an angle with respect to the vertical direction. The tool head 17 is fixed at the tip of the main shaft 32 and twelve vacuum pick-up nozzles 18 are rotatably attached to the tool head 17 along the circumference.

A pulley 35 is firmly fixed to the upper end of the main shaft 32. On the other hand, a head revolution motor 36 is attached to the carriage frame 30 and a pulley 37 is firmly fixed to the output shaft of the motor. A timing belt 38 is belted between the pulley 37 and the pulley 35 of the main shaft 32.

Also attached to the aforementioned carriage frame 30 is a nozzle spinning motor 42. A pulley 43 is firmly fixed to the output shaft of the nozzle spinning motor 42. And a pulley 45 is firmly fixed to a cylindrical sleeve 44 that is provided at the outer circumference of the main shaft 32. A timing belt 48 is belted between the pulley 43 and the pulley 45, thereby driving a nozzle spinning large gear 46 at the bottom end of the sleeve 44 to rotate. A nozzle side small gear 47 is in engagement with the nozzle spinning large gear 46, thereby driving the vacuum pick-up nozzles 18 to rotate, and this is the spinning of the nozzles 18.

Figure 5:
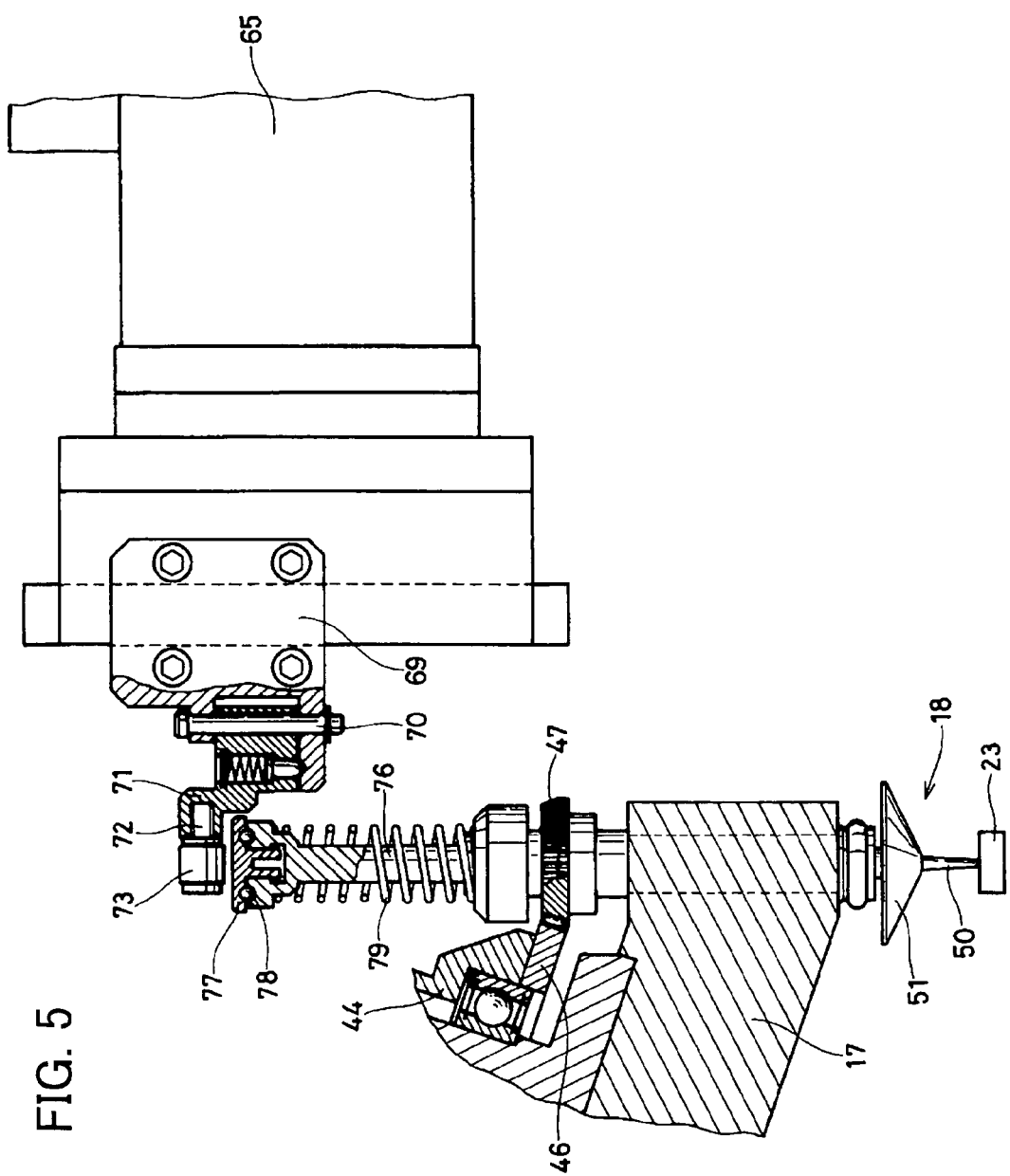
FIG. 5 is a front view illustrating an elevation mechanism of a vacuum pick-up nozzle.

As shown in FIG. 5, each vacuum pick-up nozzle 18 is provided with a vacuum pick-up portion 50 at the bottom end portion and a light absorbing plate 51 is attached at the base side of the nozzle. On the contrary, a reflection member 52 is supported on the arm portion of the carriage frame 30 as shown in FIG. 4. Illumination lamps 54 are attached to a wall portion 53 of the reflection member 52. Also, illumination lamps 56 are attached to a holder plate 55 so as to be reflected by the reflection member 52. A component camera 57 for acquiring an image of the bottom surface of the chip component 23 that is illuminated by the illumination lamps 56 and a component camera 58 for acquiring an image of the side portion of the chip component 23 that is vacuum picked up by the vacuum pick-up portion 50 are provided. Also, a circuit board camera 60 is attached to an arm 59 at the opposite side of the carriage frame 30 for acquiring an image of the upper surface of the circuit board 19.

Figure 6:
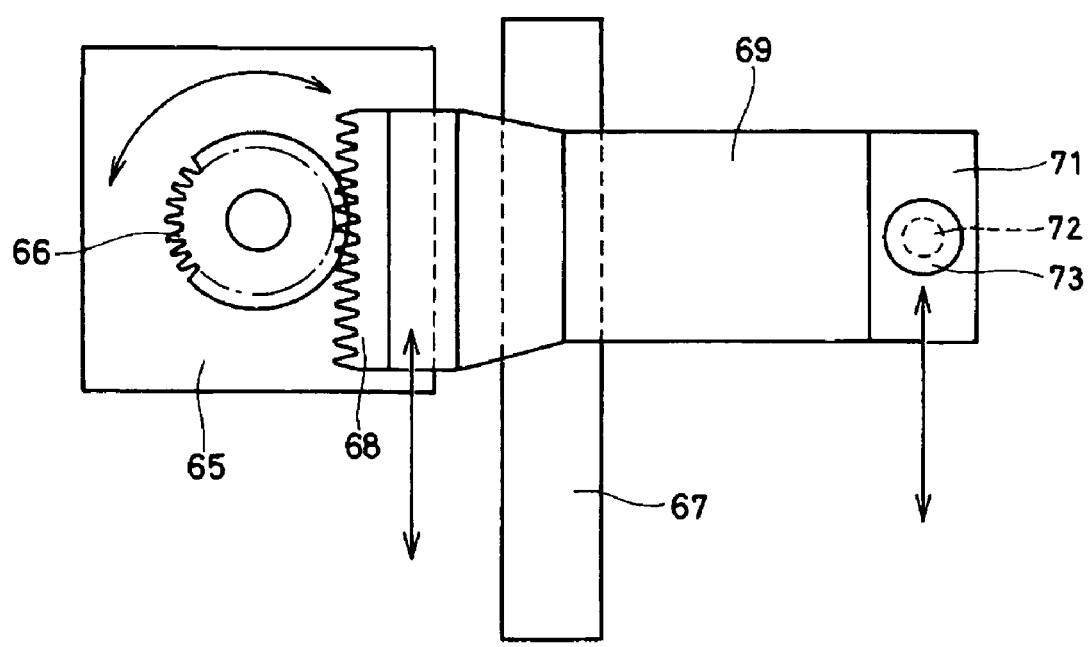
FIG. 6 is a partial elevational view illustrating the elevation mechanism.

An up/down motor 65 is disposed at the side portion of the circuit board camera 60 at the side of the carriage frame 30 by way of a bracket 64. As shown in FIG. 5 and FIG. 6, the up/down motor 65 has a pinion 66 that is firmly fixed to the output shaft of the motor. The pinion 66 is in engagement with a rack 68 that is guided to slide up/down direction by a slide guide 67. The rack 68 is provided with an up/down plate 69.

As shown in FIG. 5, a support shaft 70 is disposed vertically at an end portion of the up/down plate 69 for pivotally supporting a swinging lever 71. A pushing roller 73 is disposed at an end of the swinging lever 71 by way of a mounting shaft 72, thereby enabling the pushing roller 73 to push the upper end of the vacuum pick-up nozzle 18.

The vacuum pick-up nozzle 18 to be pushed by the pushing roller 73 comprises a pushed rod 76 at the upper end thereof and a disk 77 is rotatably supported on the upper end of the rod 76 by way of a ball 78. The pushed rod 76 is slidably biased upwardly by a return spring 79. Accordingly, when the pushed roller 73 is pushed down by the up/down motor 65 by way of the up/down plate 69 and the swinging lever 71, the pushed rod 76 goes down by way of the disk 77. When the motor 65 is reversed, the pushed rod 76 goes up by the return spring 79 and the vacuum pick-up nozzle 18 also goes up.

Figure 7:
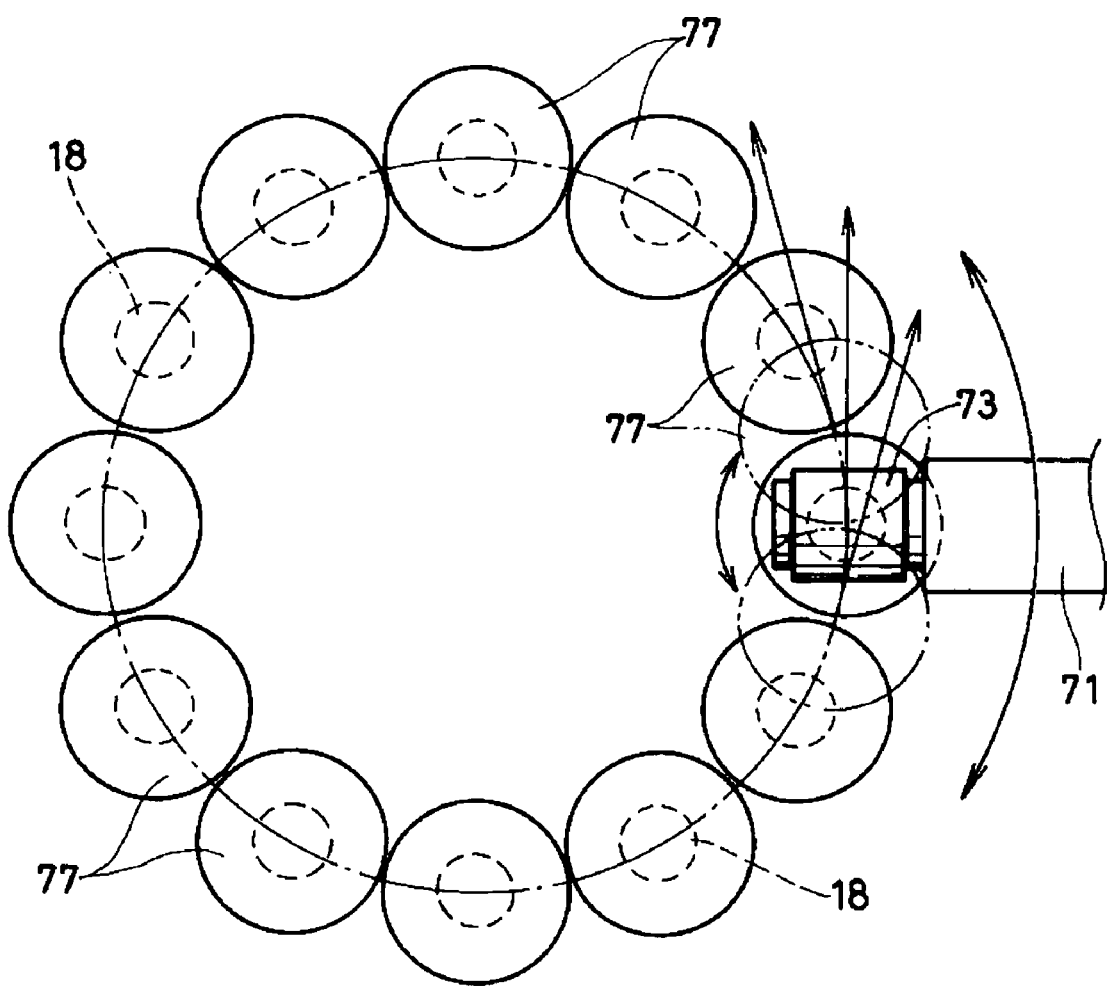
FIG. 7 is a plan view illustrating the arrangement of disks on the tool head.

Arrangement of the vacuum pick-up nozzles 18 on the tool head 17 is shown in FIG. 7. That is, the vacuum pick-up nozzles 18 are arranged along the circumference of the main shaft 32 so as to revolve by the tool head 17. And disks 77 are disposed on the upper ends of the vacuum pick-up nozzles 18 with a small gap in circumferential direction so that the pushing roller 73 can push the upper surface of a particular disk 77 that is in a designated position in the circumference of the tool head 17, thereby forcing the corresponding vacuum pick-up nozzle 18 to perform the stroke operation for vacuum pick-up and mounting of the chip component 23 at the end portion on the circuit board 19.

Figure 8:
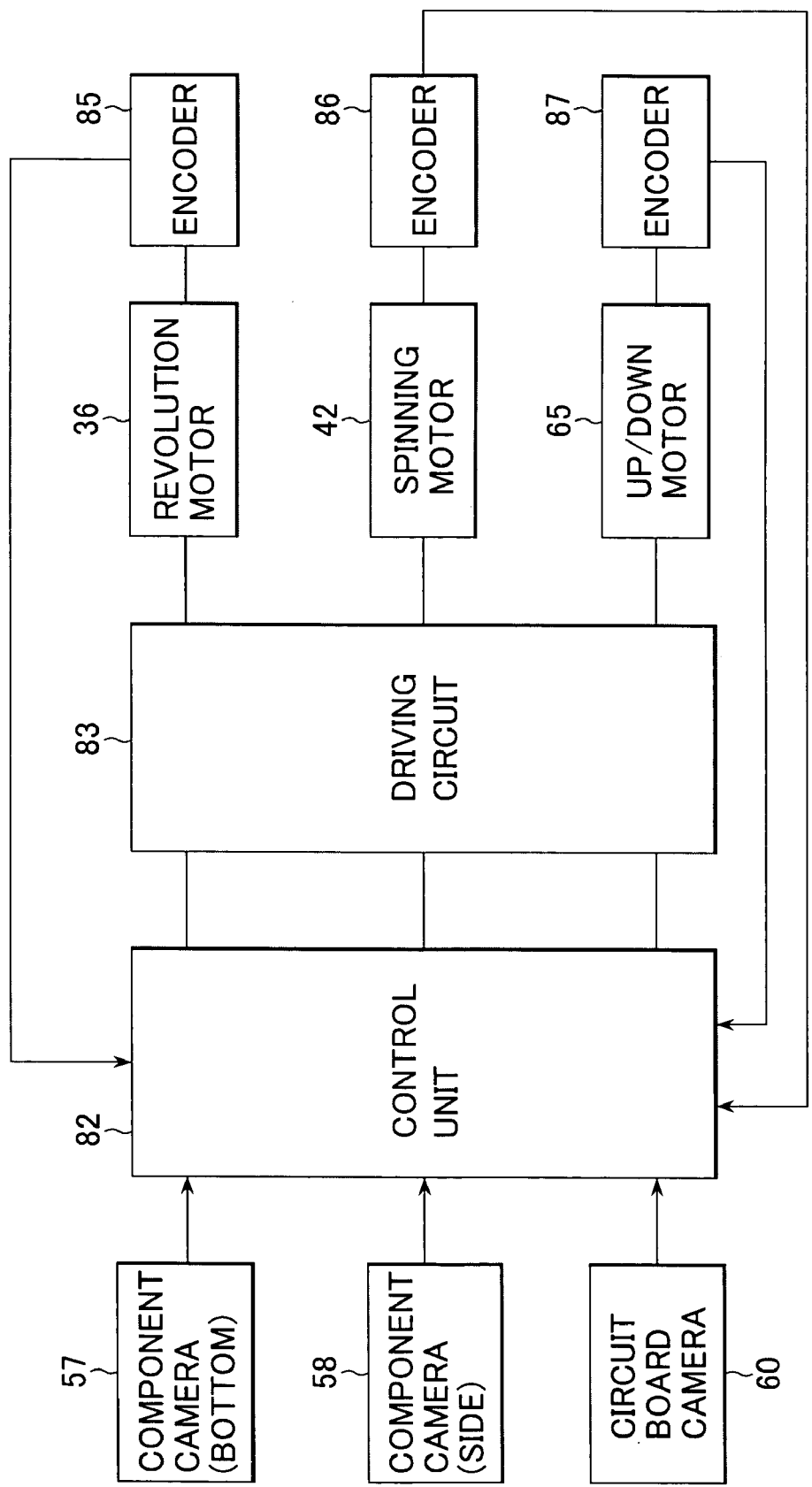
FIG. 8 is a block diagram illustrating a system construction.

Now, the system configuration of the component mounting apparatus will be described. As shown in FIG. 8, a control unit 82 is provided and information associated with the images acquired by the component cameras 57, 58 and the circuit board camera 60 are inputted in the control unit 82. And connected at the subsequent stage of the control unit 82 is a driving circuit 83 for driving the revolving motor 36, the spinning motor 42 and the up/down motor 65. These motors 36, 42, 65 are provided with respective encoders 85, 86, 87 the outputs of which are inputted to the control unit 82.

The tool head 17 controlled by the control unit as shown in FIG. 8 is designed so that the vacuum pick-up nozzles 18 pick up the respective components at the area S where the component feeders 24 are disposed. In other words, the carriage frame 30 forces the tool head 17 to move above the area S by the actuator in the Y-axis direction. When the up/down motor 65 is actuated under this condition, the up/down plate 69 goes down by the pinion 66 and the rack 68. Accordingly, the swinging lever 71 attached to the up/down plate 69 goes down so that the pushing roller 73 pushes the disk 77 of the pushed rod 76 on the upper end of the vacuum pick-up nozzle 18. Then, the pushed rod 76 goes down so that the end portion of the vacuum pick-up nozzle 18 picks the chip component 23 at the component feeding end 25 of the component feeder 24. Subsequently, the main shaft 32 of the tool head 17 is driven by the head revolution motor 38 so that the tool head 17 revolves at 30 degrees about the main shaft 32. Then, the next vacuum pick-up nozzle 18 picks up the component 23 from the component feeding end 25 of the component feeder 24 in the similar manner as the above mentioned vacuum pick-up nozzle 18. Such operation is repeated for all of the twelve vacuum pick-up nozzles 18 that are attached to the tool head 17, thereby enabling all of the vacuum pick-up nozzles 18 to pick up respective components.

At the time of up/down operation of the vacuum pick-up nozzles 18 for vacuum pick-up, the stroke of the up-down operation and the revolution of the tool head 17 are overlapped in time, thereby reducing the tact time. Such operations are shown in the flowchart in FIG. 9 and it is a CPU in the control unit 82 that controls the series of operation in accordance with the flowchart.

The tool head 17 revolves and the vacuum pick-up nozzle 18 starts to move below the actuator that is driven by the up/down motor 65. The rotary angle of the revolution motor 36 after starting the movement is detected by the output pulses of the encoder 85. When the number of pulses exceeds N1, the vacuum pick-up nozzle 18 is started so as to go down by the up/down motor 65 before the tool head 17 reaches the next pick-up position. The rotary angle of the up/down motor 65 is detected by the encoder 87 and when the number of pulses exceeds N2 corresponding to the time required for the downward stroke of the vacuum pick-up nozzle 18, such downward movement of the vacuum pick-up nozzle 18 is interrupted for picking up the component by this vacuum pick-up nozzle 18.

Subsequently, it is checked whether or not the clock pulses exceeded N3. If the clock pulses exceeded N3, it is assumed that a designated interruption time has passed and the vacuum pick-up nozzle 18 is forced to make the upward movement by the up/down motor 65. Again, in this case, when the output pulse of the encoder 87 for the up/down motor 65 exceeded N2, whether or not all of the twelve vacuum pick-up nozzles 18 picked the respective components is checked. If pick-up of the twelve nozzles 18 is not completed yet, revolution of the tool head 17 is started by the revolution motor 36 before the vacuum pick-up nozzles 18 go up completely, thereby starting a vacuum pick-up operation by the next vacuum pick-up nozzle 18.

The aforementioned operation is repeated sequentially for the twelve vacuum pick-up nozzles 18. After completing the vacuum pick-up of chip components 23 by all of the vacuum pick-up nozzles 18 provided with the tool head 17, the carriage frame 30 is then moved in the X-axis and Y-axis directions for moving the tool head 17 to the area M, or above the circuit board 19.

Subsequently, the vacuum pick-up nozzle 18 goes down by the up/down motor 65 by way of the up/down plate 69, the swinging lever 71 and the pushing roller 73, thereby mounting the chip component 23 that is vacuum picked at the bottom end of the vacuum pick-up nozzle 18. After finishing the mounting operation by a vacuum pick-up nozzle 18, the tool head 17 is rotated by 30 degrees about the main shaft 32 by the head revolution motor 36 for repeating the same operation as the mounting operation of the chip component 23 as described hereinabove. Such operation is repeated for the twelve vacuum pick-up nozzles 18 on the tool head 17.

Figure 10:
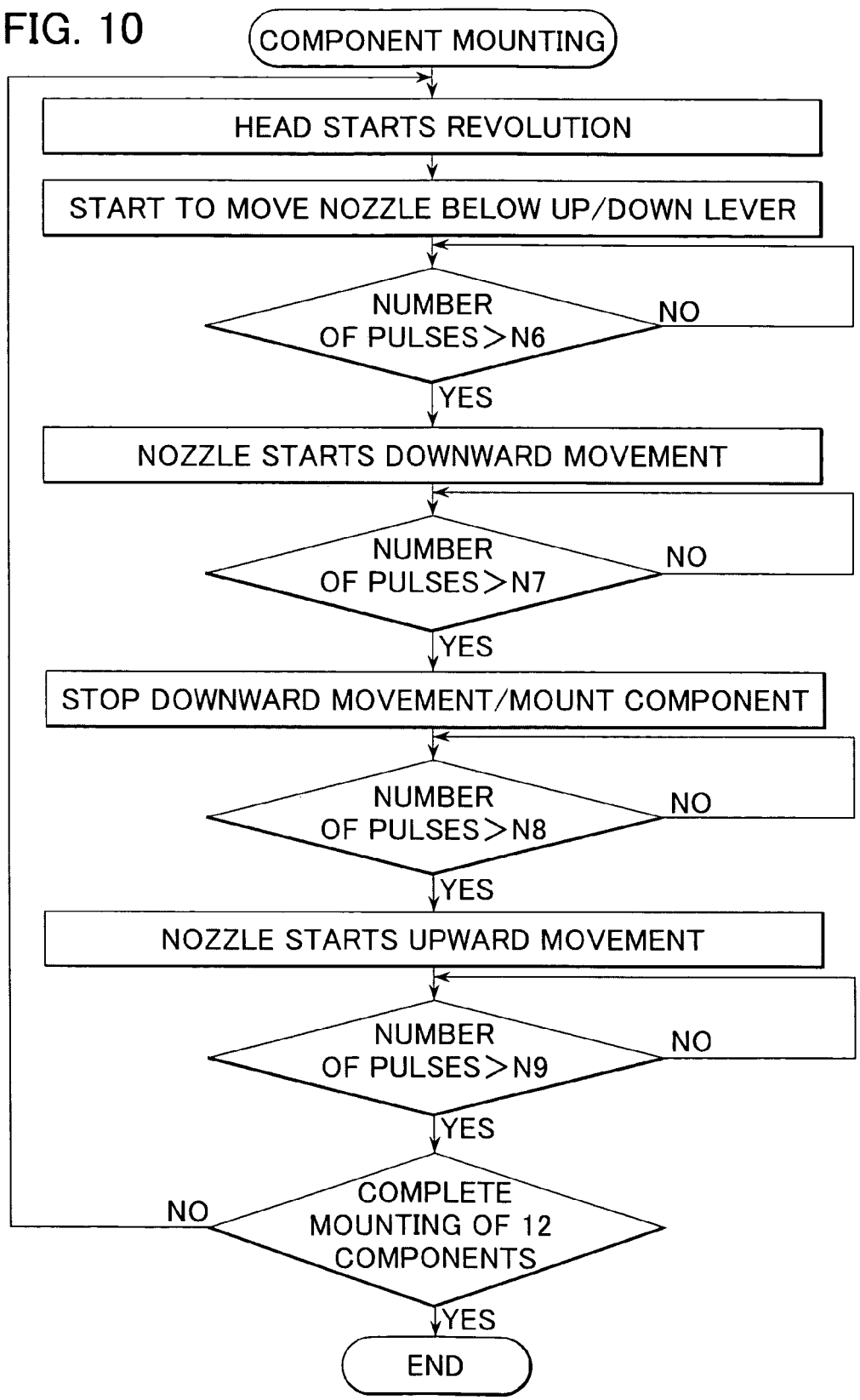
FIG. 10 is a flow chart illustrating the mounting operation of the components.

Accordingly, the tact time is reduced by overlapping in time the stroke operation of the vacuum pick-up nozzles 18 with the movement of the vacuum pick-up nozzles 18 by revolution of the tool head 17 as shown in FIG. 10.

The tool head 17 is rotated about the main shaft 32 by the head revolution motor 36 so that the subject vacuum pick-up nozzle 18 moves under the actuator of the up/down motor 65. On the way of the movement, the rotary angle of the head revolution motor 36 is detected by the encoder 85 thereof. When the number of pulses reaches N6, the downward operation of the nozzle by the up/down motor 65 is initiated. Then, the rotary angle of the up/down motor 65 is detected by the encoder 87 and at the time when the number of pulses of the encoder 87 exceeds N7, the downward movement of the up/down motor 65 is stopped for vacuum pick-up of the component.

Then, the stopping time in the downward position is detected by clock pulses. When the number of pulses exceeds N8, the up/down motor 65 is reversed. The vacuum pick-up nozzle 18 goes up by the return spring 79. And the number of turns of the up/down motor 65 is detected by the encoder 87 while the nozzle moves up. When the number of pulses exceeds N9, whether or not mounting of all of the vacuum pick-up nozzles 18 has been completed is checked. If not completed, the vacuum pick-up nozzle 18 is again moved by the head revolution motor 36 so that the next vacuum pick-up nozzle 18 comes under the actuator of the up/down motor 65 before making the complete backward movement of the vacuum pick-up nozzle 18. By repeating the operation on the twelve vacuum pick-up nozzles 18, twelve chip components 23 are accurately mounted at proper positions on the circuit board 19.

In comparison with a conventional design, FIG. 11 shows conditions where the movement in the direction of revolution and the up/down stroke of the vacuum pick-up nozzles 18 are overlapped. That is, in the conventional design, the movement and up/down operation of the vacuum pick-up nozzles are completely separated in time, while in the present invention the vacuum pick-up nozzle 18 is designed to initiate downward movement by the up/down motor 65 and the pushing roller 73 before the nozzle moves to the next position. Also, the operation to move the next vacuum pick-up nozzle 18 by the head revolution motor 36 below the actuator is initiated before the vacuum pick-up nozzle 18 completes the backward movement.

As described hereinabove, the component mounting apparatus according to the present embodiment is provided with twelve vacuum pick-up nozzles 18 on the tool head 17 for improving productivity, each vacuum pick-up nozzle 18 is positioned below the actuator comprising the up/down motor 65 by the revolution, the vacuum pick-up nozzle 18 is made to go down by the pushing roller 73 at the end portion of the swinging lever 71 for performing vacuum pick-up and mounting of the electronic components 23.

The selected vacuum pick-up nozzle 18 provided with the free rotary disk 77 at the upper end is made to go down by the roller 73 of the swinging lever 71 while moving its position for vacuum pick-up or mounting of the chip component 23. Then, the upward movement of the swinging lever 71 forces the vacuum pick-up nozzle 18 to go up by means of the return spring 79 and also to start to rotate the next selected vacuum pick-up nozzle 18 on the half way of the upward movement in overlapping respective operations. Moreover, in order to avoid mechanical interference even in case of an emergency stop or the like, the swinging lever 71 is pivotally provided at the end portion of the up/down plate 69 by way of the support shaft 70 so as to escape from the interference direction of the swinging lever 71 for moving up/down the vacuum pick-up nozzle 18. It has a significant feature to achieve improved productivity by overlapping the selection operation (revolving operation) with the up/down operation (stroke operation) of the vacuum pick-up nozzle 18 for avoiding friction and mechanical interference.

Particularly, in order to achieve overlapping the selection operation of the vacuum pick-up nozzle 18 by revolution of the tool head 17 with the up/down operation of the vacuum pick-up nozzle 18 by the actuator comprising the up/down motor 65, as shown in FIG. 7, disks 77 having sufficiently large radii for the overlapping amount of the respective shafts are provided at the upper ends of respective vacuum pick-up nozzles 18 so that the pushing roller 73 of the swinging lever 71 of the nozzle up/down actuator does not fall between adjacent nozzles 18.

Also, as shown in FIG. 7, in order to enable the selection operation of the vacuum pick-up nozzles 18 and the up/down operation of the selected vacuum pick-up nozzle 18 to overlap in time, the pushing roller 73 of the swinging lever 71 is the roller that can rotate in the moving direction of the vacuum pick-up nozzle 18 at the nozzle contacting portion of the vacuum pick-up nozzle 18. Such a particular mechanism enables the smooth revolution operation and the up/down operation to overlap in time free from friction and interference to the movement of the vacuum pick-up nozzles 18.

Moreover, as shown in FIG. 5, the above mechanism not only enables change in the position of the vacuum pick-up nozzles 18 by the revolution of the tool head 17 but also spin of the vacuum pick-up nozzles 18 by the nozzle spinning motor 42 by way of the nozzle spinning large gear 46 and the nozzle spinning small gear 47. Spinning of the vacuum pick-up nozzle 18 while the pushing roller 73 of the swinging lever 71 is in the up/down operation may cause friction between the disk 77 and the roller 73. However, such obstacle to the spinning of the vacuum pick-up nozzle 18 is eliminated by mounting the disk 77 at the upper end of the rod 76 by way of the ball 78, thereby making the disk 77 freely rotate about the center axis of the vacuum pick-up nozzle 18.

Also, as shown in FIG. 7, this particular mechanism may cause friction due to offset of the rotation direction of the pushing roller 73 from the moving direction of the vacuum pick-up nozzles 18 if the radius of revolution of the vacuum pick-up nozzles 18 at the top ends is small and if the overlapping in the moving and up/down directions of the vacuum pick-up nozzle 18 increases to such an amount that the disk 77 contacts with the pushing roller 77. However, as shown in FIG. 5, the rotatable configuration of the disk 77 helps to significantly reduce the aforementioned friction.

Figure 9:
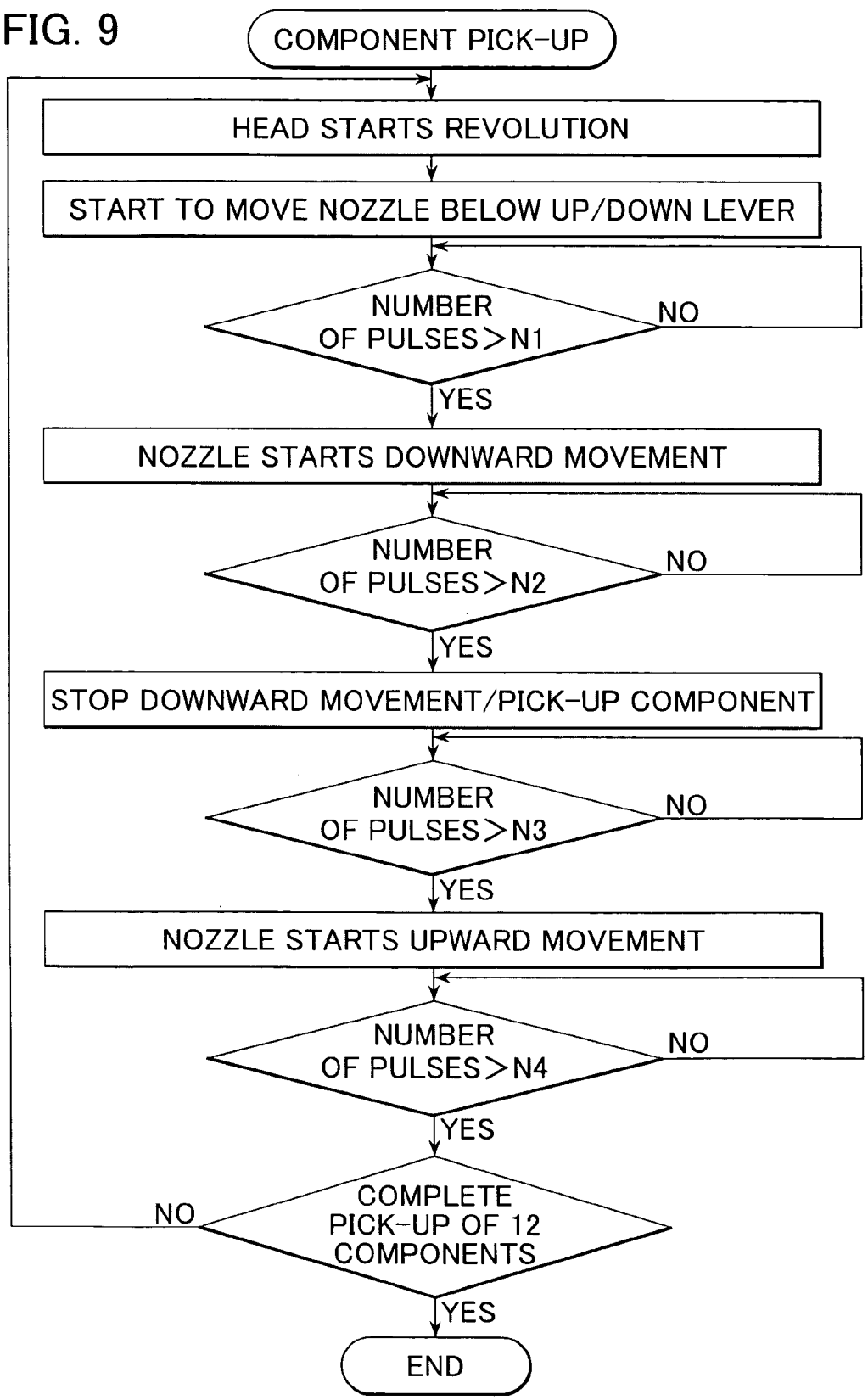
FIG. 9 is a flow chart illustrating the pick-up operation of the components.

The overlapping of the revolving movement of the vacuum pick-up nozzle 18 and the up/down operation of the vacuum pick-up nozzle is also realized by driving the shafts by the respective servo motors 36, 42, 65 as shown in FIG. 8 and controlling them in accordance with software as shown in FIG. 9 and FIG. 10. Accordingly, in case of an emergency stop or any operational lag of the motors 36, 42, 65 for some reason or another, there may be a possibility of mechanical interference. As a countermeasure for such circumstances, the swinging lever 71 is pivotally supported to the support shaft 70 at the end of the up/down plate 69 to provide a play in the direction of interference, thereby enabling the pushing roller 73 to move sideway by being pushed by the vacuum pick-up nozzle 18 in case of abnormal operation. This is effective to avoid interference of various mechanical components in the movement operation and prevent damage of such components.

Such cell type high speed mounting machine enables a large overlapping in time between the movement of the vacuum pick-up nozzles 18 and the stroke in the up/down direction, thereby significantly reducing the tact time. Moreover, in case of an emergency stop or the like, the swinging operation of the swinging lever 71 enables avoiding interference between the pushing roller 73 and the neighboring vacuum pick-up nozzle 18.

The present invention on the shown embodiment has been described hereinabove. However, it is to be noted that the present invention should not be restricted to such embodiment and that various modifications can be made without departing from the scope and spirit of the present invention. For example, although the tool head 17 is provided with twelve vacuum pick-up nozzles 18 in the above embodiment, the vacuum pick-up nozzles 18 should not be restricted to such particular number. Although the up/down motor 65, the pinion 66, the rack 68, the up/down plate 69, the swinging lever 71 and the pushing roller 73 are provided as the actuator for the up/down operation of the vacuum pick-up nozzle 18, the present invention should not be restricted to such actuator and various kinds of other actuators can be used.

The present invention finds wide applications as the mounting apparatus for mounting various components on a work.

The presently disclosed embodiments are therefore considered in all respects to be illustrative, and not restrictive. The scope of the invention is indicated by the appended claims, rather than the foregoing description, and all changes that come within the meaning and range of equivalence thereof are intended to be embraced therein.

What is claimed is:

1. A component mounting apparatus having a plurality of vacuum pick-up nozzles attached to a mount head so as to revolve about a main shaft, causing one of said vacuum pick-up nozzles to move to a location to be driven by an actuator that is provided at a designated location in the direction of revolution, and causing said vacuum pick-up nozzle to make a forward movement by said actuator for vacuum pick-up and/or mounting of a component;

wherein each of said vacuum pick-up nozzles is provided with a pushed plate of a designated size in the direction of revolution of said vacuum pick-up nozzle at a driven portion thereof, said designated size being approximately equal to the distance between adjacent vacuum pick-up nozzles, wherein said actuator comprises:

an up/down plate in communication with an up/down motor;

a swing lever pivotally provided at an end portion of said up/down plate; and a pushing roller disposed at an end of said swing lever for pushing an end of at least one of said vacuum pick-up nozzles to cause said vacuum pick-up nozzle to make a forward movement simultaneously as said mount head revolves about said main shaft.

2. The component mounting apparatus according to claim 1, wherein said pushed plate is a circular disk.

3. The component mounting apparatus according to claim 2, wherein said circular disk is rotatably attached to said vacuum pick-up nozzle.

4. The component mounting apparatus according to claim 2, wherein said circular disk is rotatably attached to said vacuum pick-up nozzle, the axis of rotation for said circular disk is parallel to the direction of forward movement of the attached vacuum pick-up nozzle, and the circular disk can rotate about said axis freely with respect to the attached vacuum pick-up nozzle.

5. The component mounting apparatus according to claim 1, wherein the pushing roller of said actuator is a roller that rotates in said direction of revolution.

6. The component mounting apparatus according to claim 1, wherein a the swing lever of said actuator is swingable.

7. The component mounting apparatus according to claim 6, wherein the pushing roller of said actuator is a roller rotatably supported by the swing lever that swingably pivots about a supporting shaft.

8. A component mounting apparatus having a plurality of vacuum pick-up nozzles attached to a mount head so as to revolve about a main shaft, causing one of said vacuum pick-up nozzles to move to a location to be driven by an actuator that is provided at a designated location in the direction of revolution, and causing said vacuum pick-up nozzles to make a forward movement by said actuator for vacuum pick-up and/or mounting of a component, wherein a control means is provided for controlling at least one of said vacuum pick-up nozzles to make a forward movement by said actuator at the time when said actuator is moved to a location not to interfere with an adjacent vacuum pick-up nozzle in the process of moving said vacuum pick-up nozzles in the direction of revolution by said actuator to a location to be operated by said actuator, wherein said actuator comprises:

an up/down plate in communication with an up/down motor;

a swing lever pivotally provided at an end portion of said up/down plate; and a pushing roller disposed at an end of said swing lever for pushing an end of at least one of said vacuum pick-up nozzles to cause said vacuum pick-up nozzle to make a forward movement simultaneously as said mount head revolves about said main shaft, wherein each of said vacuum pick-up nozzles is provided with a pushed plate of a designated size in the direction of revolution of said vacuum pick-up nozzle at a driven portion thereof, said designated size being approximately equal to the distance between adjacent vacuum pick-up nozzles.

9. The component mounting apparatus according to claim 8, wherein said vacuum pick-up nozzle moves forward to pick up or mount said component.

10. The component mounting apparatus of claim 8, wherein a control means is provided for controlling said mounting head to revolve about said main shaft at the time when said actuator makes a backward movement to a position not to interfere with an adjacent vacuum pick-up nozzle in the process of backward movement of said vacuum pick-up nozzle.

11. A component mounting apparatus having a plurality of vacuum pick-up nozzles attached to a mount head so as to revolve about a main shaft, causing one of said vacuum pick-up nozzles to move to a location to be driven by an actuator that is provided at a designated location in the direction of revolution, and causing said vacuum pick-up nozzles to make a forward movement by said actuator for vacuum pick-up and/or mounting of a component, wherein a control means is provided for controlling said mounting head to revolve about said main shaft at the time when said actuator makes a backward movement to a position not to interfere with an adjacent vacuum pick-up nozzle in the process of backward movement of said vacuum pick-up nozzle, wherein said actuator comprises:

an up/down plate in communication with an up/down motor;

a swing lever pivotally provided at an end portion of said up/down plate; and a pushing roller disposed at an end of said swing lever for pushing an end of at least one of said vacuum pick-up nozzles to cause said vacuum pick-up nozzle to make a forward movement simultaneously as said mount head revolves about said main shaft, wherein each of said vacuum pick-up nozzles is provided with a pushed plate of a designated size in the direction of revolution of said vacuum pick-up nozzle at a driven portion thereof, said designated size being approximately equal to the distance between adjacent vacuum pick-up nozzles.

12. The component mounting apparatus according to claim 11, wherein said backward movement of said vacuum pick-up nozzle is made subsequent to vacuum pick-up or mounting of said component by said vacuum pick-up nozzle.

13. The component mounting apparatus according to either one of claim 1, 8, or 11, wherein said vacuum pick-up nozzle picks up said component while revolving about said main shaft and also mounts said picked up component on a designated location on a circuit board.

14. The component mounting apparatus according to either one of claim 1, 8, or 11, wherein said vacuum pick-up nozzle spins about its own axis after picking up said component and also mounts said picked up component on a designated location on a circuit board.

15. A component mounting apparatus comprising:
a mount head revolveable about a main shaft;
a plurality of vacuum pick-up nozzles moveable in a forward direction and a backward direction attached to the mount head;
an actuator comprising:
an up/down plate in communication with an up/down motor,
a swing lever pivotally provided at an end portion of said up/down plate, and
a pushing roller disposed at an end of said swing lever for pushing an end of at least one of said vacuum pick-up nozzles to cause said vacuum pick-up nozzle to make a forward movement; and
a control unit for controlling revolving movement of the mount head and forward movement and backward movement of at least one of the vacuum pick-up nozzles, wherein the revolving movement and one of the forward movement and backward movement are operated simultaneously to reduce tact time,
wherein each of said vacuum pick-up nozzles is provided with a pushed plate of a designated size in the direction of revolution of said vacuum pick-up nozzle at a driven portion thereof, said designated size being approximately equal to the distance between adjacent vacuum pick-up nozzles.

* * * * *

UNITED STATES PATENT AND TRADEMARK OFFICE
CERTIFICATE OF CORRECTION

PATENT NO. : 7,340,827 B2
APPLICATION NO. : 10/981790
DATED : March 11, 2008
INVENTOR(S) : Atsushi Saito et al.

Page 1 of 1

It is certified that error appears in the above-identified patent and that said Letters Patent is hereby corrected as shown below:

Column 17, Line 55:
"a the swing" should read -- the swing --.

Signed and Sealed this

First Day of July, 2008

JON W. DUDAS
*Director of the United States Patent and Trademark Office*